(12) United States Patent  
Oshima et al.

(10) Patent No.: US 9,349,704 B2
(45) Date of Patent: May 24, 2016

(54) JOINTED STRUCTURE AND METHOD OF MANUFACTURING SAME

(71) Applicant: KABUSHIKI KAISHA TOYOTA CHUO KENKYUSHO, Nagakute-shi, Aichi-ken (JP)

(72) Inventors: Tadashi Oshima, Nagakute (JP); Hirofumi Ito, Nagakute (JP); Hisaaki Takao, Nagakute (JP)

(73) Assignee: KABUSHIKI KAISHA TOYOTA CHUO KENKYUSHO, Nagakute-shi (JP)

( * ) Notice: Subject to any disclaimer, the term of this patent is extended or adjusted under 35 U.S.C. 154(b) by 0 days.

(21) Appl. No.: 14/618,269

(22) Filed: Feb. 10, 2015

(65) Prior Publication Data

US 2015/0270238 A1 Sep. 24, 2015

(30) Foreign Application Priority Data

Mar. 20, 2014 (JP) ................. 2014-059139

(51) Int. Cl.
*H01L 23/48* (2006.01)
*H01L 23/52* (2006.01)
*H01L 29/40* (2006.01)
*H01L 23/00* (2006.01)

(52) U.S. Cl.
CPC ............... *H01L 24/29* (2013.01); *H01L 24/05* (2013.01); *H01L 24/83* (2013.01); *H01L 2224/04026* (2013.01); *H01L 2224/05005* (2013.01); *H01L 2224/29005* (2013.01); *H01L 2224/29026* (2013.01); *H01L 2224/32225* (2013.01); *H01L 2224/83091* (2013.01); *H01L 2224/83095* (2013.01); *H01L 2924/01013* (2013.01); *H01L 2924/01029* (2013.01); *H01L 2924/12042* (2013.01); *H01L 2924/13055* (2013.01); *H01L 2924/35121* (2013.01)

(58) Field of Classification Search
None
See application file for complete search history.

(56) References Cited

U.S. PATENT DOCUMENTS

| | | | |
|---|---|---|---|
| 5,251,803 A * | 10/1993 | Kashiba et al. | 228/124.5 |
| 2015/0044496 A1* | 2/2015 | Oshima | B23K 20/10 428/612 |
| 2015/0115452 A1* | 4/2015 | Yoon et al. | 257/762 |
| 2015/0144385 A1* | 5/2015 | Ohashi et al. | 174/258 |

FOREIGN PATENT DOCUMENTS

| | | |
|---|---|---|
| JP | S56-78130 A | 6/1981 |
| JP | H0786444 A | 3/1995 |
| JP | 2012253242 A | 12/2012 |
| JP | 2013198924 A | 10/2013 |
| WO | WO 201314100 A1 * | 9/2013 ............. B23K 20/10 |

OTHER PUBLICATIONS

Feb. 23, 2016 Office Action issued in Japanese Patent Application No. 2014-059139.

* cited by examiner

*Primary Examiner* — Hoang-Quan Ho
(74) *Attorney, Agent, or Firm* — Oliff PLC

(57) ABSTRACT

A jointed structure comprises a first metal layer and a second metal layer. The first metal layer and the second metal layer are jointed together and have different coefficients of thermal expansion. The first metal layer and the second metal layer are jointed together by solid-phase joining via a jointing interface microstructure, wherein the jointing interface microstructure includes an amorphous oxide phase and having a thickness of 50 nm or less.

6 Claims, 3 Drawing Sheets

JOINTED STRUCTURE AND METHOD OF MANUFACTURING SAME

TECHNICAL FIELD

The present invention relates to a jointed structure which can improve heat characteristics such as heat resistance property at a jointed part between metal layers having different coefficients of thermal expansion. The present invention relates also to a method of manufacturing the jointed structure.

BACKGROUND ART

Power modules are used for inverters and other components for driving motors. Power modules are configured such that power devices (semiconductor devices) such as IGBTs (Insulated Gate Bipolar Transistors) are mounted on insulating multilayer substrates. Specifically, such a power module employs an insulating multilayer substrate configured such that metal layers are provided on both surfaces of a ceramic layer that constitutes an insulating layer. One surface side of the insulating multilayer substrate is equipped with (mounted thereon with) a power device. The other surface side of the insulating multilayer substrate is ordinarily provided with a cooler (heat dissipator) such as a heat sink.

For next-generation semiconductor devices, SiC, GaN and $Ga_2O_3$ are expected to be used as substitute for Si, and the operating temperature will be further increased. Accordingly, more enhanced heat resistance property is required for power modules and each bonded part thereof.

In power devices, the applied voltage and the amount of electric current are large, and the amount of heat generation is accordingly also large during the operation. In order to stably operate power devices, therefore, it is necessary not only to improve the heat resistance property but also to efficiently dissipate the generated heat so that the heat is received by the insulating multilayer substrate, the cooler and other components without being accumulated.

In addition, plural layers of different materials exist in a heat-transfer path from the power devices to the cooler or the like, and thermal stresses are generated in respective bonded parts depending on the difference in coefficient of thermal expansion and the temperature difference (or temperature gradient). Unduly large thermal stresses cause the layers to readily delaminate at the bonding interfaces in accordance with the increase in the number of cooling/heating cycles acting on the power module, so that the reliability of the power module may deteriorate. Therefore, if the power module has a structure that relaxes the thermal stress acting on each bonded part, the reliability will further be improved. From such a viewpoint, various proposals are presented. For example, relevant descriptions are disclosed in the following patent literature.

CITATION LIST

Patent Literature

[PTL 1]
JP7-86444A (1995)
[PTL 2]
JP2012-253242A

SUMMARY OF INVENTION

Technical Problem

Patent Literature 1 proposes a composite heat dissipating substrate for semiconductors which is configured such that a stress relaxing metal layer is bonded to a substrate by diffusion bonding. Patent Literature 2 proposes a bonded structure provided with an intermediate layer between a semiconductor device and an electrode to which the semiconductor device is bonded, wherein the Young's modulus of the intermediate layer is appropriately adjusted.

However, such substrate and bonded structure cannot sufficiently respond to the above-described requirements even in combination with additional features. Moreover, diffusion bonding as used in Patent Literature 1 is not suitable for mass production of power modules because the metal layers to be bonded together have to be held at a high temperature for a long period of time while being pressurized. In addition, bonded parts formed by solid-phase diffusion are in a state where a mixture layer in which components of each layer to be bonded are mixed is present with some width, and may negatively affect the characteristics of power modules.

The present invention has been created in view of such circumstances, and an object of the present invention is to provide a novel jointed structure which has a different bonded part than the conventional ones and which is excellent in heat conductivity, heat resistance property or thermal stress relaxing ability. Another object of the present invention is to provide a method of manufacturing the jointed structure.

Solution to Problem

As a result of intensive studies to solve the above problems and repeating trial and error, the present inventors have succeeded in easily bonding metal layers by solid-phase bonding even in a low temperature range with low pressure, by providing the bonding surfaces to be bonded of the metal layers with a specified profile. Developing this achievement, the present invention has been accomplished as will be described hereinafter.

<<Jointed Structure>>

(1) According to an aspect of the present invention, there is provided a jointed structure comprising a first metal layer (or a first member having the first metal layer) and a second metal layer (or a second member having the second metal layer). The first metal layer and the second metal layer are jointed together and have different coefficients of thermal expansion. The jointed structure is characterized in that the first metal layer and the second metal layer are jointed together by solid-phase joining via a joining interface microstructure, and the joining interface microstructure has a thickness of 50 nm or less.

According to another aspect of the present invention, there is provided a jointed structure comprising: a heat generating body that is a heat generating source; a first metal layer that receives heat from the heat generating body; a second metal layer that is jointed to the first metal layer and receives heat from the first metal layer; and a base body that receives heat from the second metal layer. The jointed structure is characterized in that the first metal layer and the second metal layer are jointed together by solid-phase joining via a joining interface microstructure, and the joining interface microstructure has a thickness of 50 nm or less.

(2) In the case of the jointed structure of the present invention, the joining interface microstructure can be formed as a joining phase to have a very small width of about several to several tens nanometers at the joining interface between the first metal layer and the second metal layer which are jointed by solid-phase joining Except for the very thin joining interface microstructure, the adjacent microstructure to the joining interface (referred to as an "interface adjacent microstructure") is unlikely to change between before and after the joining as well as the peripheral microstructure around the joining interface (referred to as an "interface peripheral microstructure"), and approximately the same state is maintained before and after the joining Namely, in the jointed structure of the present invention, the first metal layer and the second metal layer are unlikely to change between before and after the joining, and are in a state as if they are jointed together by solid-phase joining without any change.

Thus, the first metal layer and the second metal layer according to the present invention are rigidly integrated without another layer, such as brazing material (e.g., solder), adhesive and modified layer, which causes thermal resistance and delamination. This joining state is stably maintained even under a high temperature and cooling/heating cycle. In such a manner, the jointed structure of the present invention brings out excellent heat conductivity (heat transference), heat resistance property, thermal shock resistance, or other appropriate properties.

(3) The first metal layer and the second metal layer to be jointed together may be formed of the same material and in the same form (such as thickness), but may more preferably be formed of materials and in forms which can relax the thermal stress generating at the jointed part. For example, it is preferred that the first metal layer at the heat generating body side (higher temperature side) has a higher elastic modulus (Young's modulus) than that of the second metal layer at the base body side (lower temperature side). This allows the second metal layer to readily deform in accordance with the thermal stress acting on the joining interface, and the second metal layer can function as a so-called stress relaxing layer. Consequently, the thermal stress generated at the joining interface is likely to be reduced, so that the reliability of the jointed structure can be improved. Note that the elastic modulus as referred to herein may be any of a longitudinal elastic modulus (E) and a transverse elastic modulus (G).

If the thickness of the second metal layer is unduly small in comparison, its own allowable deformation amount is small even when the elastic modulus of the second metal layer is low, so that the thermal stress relaxing ability may deteriorate between both surfaces (between the joining surface at the heat generating body side and the joining surface at the base body side). It is therefore preferred that the second metal layer has a larger thickness at least than that of the first metal layer. Note that the thickness as referred to herein is a length that is measured in the normal direction to the joining surface (heat flow direction).

One example of the jointed structure of the present invention is a power module (or a part thereof). In this case, the heat generating body is a semiconductor device, the first metal layer is an electrode layer of the semiconductor device, the second metal layer is a wiring layer, and the base body is an insulating layer, for example. It is preferred in this case that the electrode layer is a copper layer, the wiring layer is an aluminum layer, and the base body is a ceramic layer, for example. Note that the Young's modulus of pure copper is about 130 GPa while the Young's modulus of pure aluminum is about 70 GPa, which is lower than that of pure copper.

<<Method of Manufacturing Jointed Structure>>

(1) The jointed structure as described above can be obtained through the manufacturing method of the present invention as below, for example. That is, according to a further aspect of the present invention, there is provided a method of manufacturing a jointed structure. The jointed structure comprises a first metal layer (or a first member having the first metal layer) and a second metal layer (or a second member having the second metal layer). The first metal layer and the second metal layer are jointed together and have different coefficients of thermal expansion. The method is characterized in that: the first metal layer has a first joining surface that is a joining surface before joining; the second metal layer has a second joining surface that is a joining surface before joining; each of the first joining surface and the second joining surface has a fine irregular profile; the fine irregular profile has a surface roughness of 0.02 micrometers or less as a center line average roughness (Ra) and an actual surface area (So) that is larger by 15% or more than a reference surface area (St) calculated from an outer shape dimension; the method comprising: causing the first joining surface and the second joining surface to be in contact with each other and applying pressure, temperature or vibration thereby to joint the first joining surface and the second joining surface to each other.

According to a still further aspect of the present invention, there is provided a method of manufacturing a jointed structure. The method comprises a joining step of joining a first metal layer and a second metal layer together. The first metal layer is located at the side of a heat generating body as a heat generating source. The second metal layer is located at the side of a base body. Generated heat in the heat generating body is transferred to the base body via a joining interface between the first metal layer and the second metal layer. The method is characterized in that: the first metal layer has a first joining surface that is a joining surface before joining; the second metal layer has a second joining surface that is a joining surface before joining; each of the first joining surface and the second joining surface has a fine irregular profile; the fine irregular profile has a surface roughness of 0.02 micrometers or less as a center line average roughness (Ra) and an actual surface area (So) that is larger by 15% or more than a reference surface area (St) calculated from an outer shape dimension; and the joining step is a step of causing the first joining surface and the second joining surface to be in contact with each other and applying pressure, temperature or vibration.

(2) According to the manufacturing method of the present invention, the above-described jointed structure can easily be obtained. The reason of this is not necessarily sure, but it appears to be as follow in the present circumstances. The joining surface to be jointed according to the present invention comprises a fine irregular profile, and the actual surface area is thus considerably large. This causes the joining surface to have a significantly large surface energy, and in other words, an unstable state occurs. However, even such a joining surface will be provisionally in a stable energy state because the outermost surface is covered by films such as oxidation films and adsorption films of organic substances if being exposed to the air or the like. In this case, the joining surfaces according to the present invention will not be jointed together merely by being pressed lightly against each other.

However, if a slight trigger (such as heating, pressurizing, and vibrating) is applied to between the joining surfaces in contact with each other, a high surface energy possessed originally by the joining surfaces of the fine irregular profiles is released at once. This high surface energy generates a driving force to remove contamination layers (such as oxidation films) which inhibited the joining between the joining surfaces, and the joining between the joining surfaces is thus to be induced spontaneously. In addition, in the case of the jointed structure of the present invention, the surface roughness of the joining surfaces is good, so that the activated joining surfaces uniformly come close to each other at their entire and the joining readily occurs at the entire area. It thus appears that the first metal layer and the second metal layer according to the present invention can be rigidly jointed by solid-phase joining even in the air atmosphere of a normal temperature range merely by being applied thereto with a low pressure, a low temperature or a small vibration and the like. As will be understood, the first metal layer and the second metal layer may be jointed in an inert gas atmosphere or in a vacuum atmosphere where an oxide film and the like may not be formed on the joining surfaces to be jointed.

<<Others>>

Unless otherwise stated, a numerical range "x to y" as referred to herein includes the lower limit value x and the upper limit value y. Various numerical values or any numerical value included in numerical ranges described herein may be freely selected or extracted as a new lower limit value or upper limit value, and any numerical range such as "a to b" may thereby be newly provided using such a new lower limit value or upper limit value.

DESCRIPTION OF EMBODIMENTS

Figure 1:
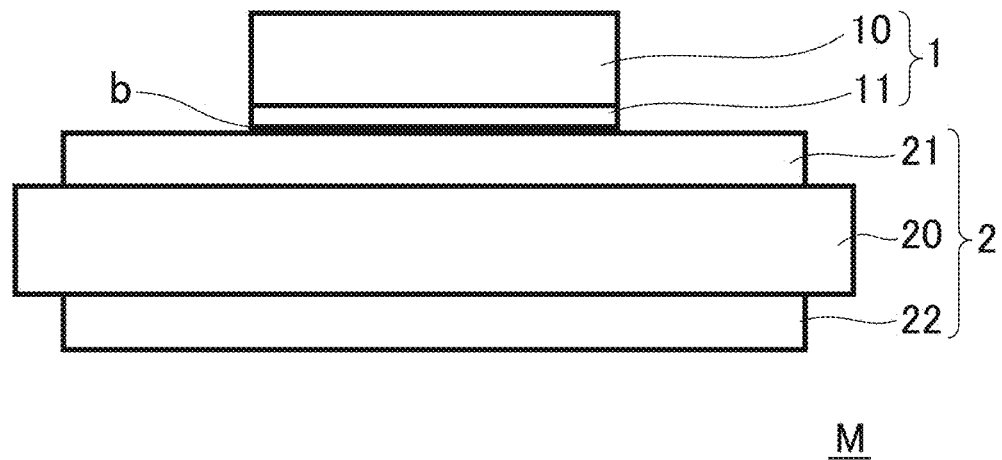
FIG. 1 is a schematic view illustrating a power module as one example of the jointed structure according to the present invention.

The contents described herein may cover not only the jointed structure of the present invention but a method of manufacturing the same. Features regarding the manufacturing method, when understood as a product-by-process claim, may also be features regarding a product. One or more features freely selected from the description herein may be added to the above-described features of the present invention. Which embodiment is the best or not may be different in accordance with objectives, required performance and other factors.

<<Heat Generating Body and Base Body>>

A variety of combinations may be considered for the heat generating body and the base body. When the jointed structure of the present invention is an electronic module, one example of the heat generating body may be an electronic device such as semiconductor device, and one example of the base body may be a substrate which is equipped with the electronic device.

In this case, the type of the electronic device is not limited, but the jointed structure of the present invention is suitable for a power device, such as IGBT, which has a particularly large amount of heat generation. The electronic device may be a Si chip or other appropriate chip, such as a SiC chip, a GaN chip and a $Ga_2O_3$ chip.

In this case, a metal substrate formed of aluminum or the like may be used as the substrate, but an insulating substrate formed of ceramic may ordinarily be used. Various types of ceramics are present, but AlN, $Si_3N_4$, $Al_2O_3$ and the like may be used, for example, because they are excellent in the heat conductivity.

<<Metal Layer>>

The first metal layer and the second metal layer (both are collectively referred also to as "metal layers" in simple) may be or may not be formed of the same material, and the material or materials of the metal layers are not limited. For example, there may be used various metals, such as copper (Cu), aluminum (Al), gold (Au), silver (Ag), tin (Sn), nickel (Ni) and alloys thereof, which are excellent in the heat conductivity (and electric conductivity). In particular, metals having a relatively low elastic modulus (Young's modulus) (e.g., metals such as Al having an elastic modulus of 100 GPa or less) may be preferred because the joining surfaces to be jointed are likely to be in close contact with each other and such metals readily function as a stress relaxing layer.

In the case of the above-described electronic module, for example, the first metal layer may be an electrode layer that is formed at one surface side of an electronic device (heat generating body), and the second metal layer may be a wiring layer (or a stress relaxing layer) or the like that is formed on a substrate (base body). More specifically, the first metal layer may be a copper electrode layer of a semiconductor device, and the second metal layer may be a copper layer or an aluminum layer that is attached to a ceramic layer (insulating layer) by metallization or adhesion.

A multilayer insulating substrate may be configured to have a ceramic layer provided with a metal layer or metal layers. For example, a DBA (Direct Brazed Aluminum) substrate is configured such that both surfaces of an AlN layer are laminated with aluminum layers, and a DBC (Direct Brazed Copper) substrate is configured such that both surfaces of the substrate are laminated with copper layers. Thus, a similar metal layer (third metal layer) to the second metal layer is ordinarily formed on the opposite side to the second metal layer. The third metal layer may be provided thereon with a heat-transfer equipment (heat dissipating equipment), such as a heat sink, a heat spreader, and a cooler in which coolant flows.

<<Joining Interface Microstructure>>

In the jointed structure of the present invention, the first metal layer and the second metal layer are jointed by solid-phase joining, and almost all the microstructure in the jointed part (including the adjacent region to the joining interface and the peripheral region of the joining interface) may not change between before and after the joining Even if some microstructure change occurs, there may be generated at the most a very thin joining layer (joining interface microstructure having a thickness of 50 nm or less in an embodiment, or 20 nm or less in another embodiment) which cannot be observed through an ordinary electron microscope.

It has been confirmed that, when the joining is performed in an oxidizing atmosphere, an amorphous oxide phase or the like is slightly formed as the joining interface microstructure depending on the surface states of the joining surfaces to be jointed of the first metal layer and the second metal layer, the joining environment, and the like. This amorphous oxide phase appears to originate from oxide films that have been generated on the joining surfaces (joining surfaces to be jointed) before the joining. It is to be noted that, even if such an amorphous oxide phase is once generated, the amorphous oxide phase can disappear due to diffusion, solid solution and the like of oxygen (O) to the vicinity of the joining interface during the subsequent heating or other treatment. Therefore, the existence of the joining interface microstructure is not an essential feature in the jointed structure of the present invention.

<<Manufacturing Method/Joining Method>>

Manufacturing method for the jointed structure of the present invention is not limited. The first metal layer and the second metal layer, which are formed with joining surfaces to be jointed each having a defined fine irregular profile as described above, may be merely pressed against each other in a low temperature region, and a jointed structure can thereby be obtained in which both layers are ensured to be jointed by solid-phase joining. Hereinafter, descriptions will be directed first to the form of the joining surfaces to be jointed and next to the joining step for joining the joining surfaces to each other.

[Joining Surface to be Jointed]

(1) Surface Roughness

When the manufacturing method of the present invention is performed, the surface energy of the joining surfaces to be jointed of the first metal layer and the second metal layer may have to be enhanced before the joining Effective method for enhancing the surface energy is to form the joining surfaces each with a defined fine irregular profile. Specifically, the joining surfaces may preferably be formed to have a surface roughness of 0.02 micrometers or less in an embodiment, or 0.01 micrometers or less in another embodiment, as a center line average roughness (Ra/JIS). According to another aspect, the surface roughness may preferably be 0.2 micrometers or less in an embodiment, or 0.1 micrometers or less in another embodiment, as a maximum height (Rmax/JIS).

If the surface roughness of the joining surfaces to be jointed is unduly large, the joining between the joining surfaces will be insufficient. In particular, unduly large Ra may make it difficult to allow for uniform joining Unduly large Rmax may also not be preferred because a large pressurizing force is required for the joining surfaces to be in close contact with each other.

The lower limit of each surface roughness is not limited as long as the surface area increasing ratio is sufficiently ensured. Suffice it to say that the Ra may preferably be 0.001 micrometers or more in an embodiment, or 0.005 micrometers or more in another embodiment. The Rmax may preferably be 0.005 micrometers or more in an embodiment, or 0.01 micrometers or more in another embodiment.

(2) Surface Area Increasing Ratio

As the fine irregular profile of the joining surfaces to be jointed of the metal layers according to the present invention have a sufficiently large actual surface area, the surface energy is enhanced to allow the solid-phase joining to be readily induced, which may be preferred. Specifically, a surface area increasing ratio (delta)So=100*(So−St)/So (%), which is a ratio of the increase in an actual surface area (So) to a reference surface area (St) calculated from the outer shape dimension, may preferably be 15% or more in an embodiment, or 18% or more in another embodiment. If the surface area increasing ratio is unduly small, the joining between the metal layers will not be facilitated.

The reference surface area (St) is obtained, on the assumption that the joining surfaces to be jointed have an ideal flat surface, from the outer shape dimension thereof. The actual surface area (So) is obtained by measuring the joining surfaces to be jointed, using a non-contact surface profiler (e.g., ZYGO NewView5022 available from Canon Inc.) or a scanning probe microscope (e.g., SPM9500J3 available from SHIMADZU CORPORATION). Unless otherwise stated, numerical values obtained using a non-contact surface profiler are employed in the present description.

(3) Formation of Joining Surface to be Jointed

The joining surfaces having such surface roughness and surface area increasing ratio can be formed through various methods. Examples of such methods include plasma treatment, nano-machining, chemical etching, laser texturing, and sputtering.

[Joining Step]

In a state where the joining surface to be jointed of the first metal layer and the joining surface to be jointed of the second metal layer are in contact (or in close contact) with each other, a trigger such as pressurizing, heating and vibrating is applied to the joining surfaces, and the high surface energy possessed by the joining surfaces is thereby released to accomplish the solid-phase joining.

This joining step can be performed in an ordinary temperature range, but may preferably be performed under a heated temperature, such as 300 degrees C. or less in an embodiment, or 250 degrees C. or less in another embodiment, because the heated temperature facilitates the solid-phase joining The pressing of the joining surfaces to each other may be enough if the pressurizing pressure is 30 MPa or less in an embodiment, 20 MPa or less in another embodiment, 10 MPa or less in a further embodiment, or 5 MPa or less in a still further embodiment, for example. When the joining surfaces to be jointed are vibrated, it may be enough to apply ultrasonic vibration of a frequency of 50 kHz or less, an output of 100 W or less, and a vibrating time of 2 seconds or less, for example. The joining step can be performed in the air atmosphere, but may preferably be performed in an inert gas atmosphere, in a vacuum atmosphere or in other appropriate atmosphere because a joining interface microstructure that contains oxygen and other impurities is suppressed from being formed in such an atmosphere.

<<Intended Use>>

The jointed structure of the present invention may be used, but are not limited to the uses, for various components, apparatuses, instruments or other industrial products. In particular, when the jointed structure of the present invention is used for highly-densely mounted components such as for cars, next-generation power modules and the like, a bonding material (such as solder) is not required to be interposed between the metal layers, and it is possible to improve the heat conductivity, heat resistance property, reliability or other appropriate properties.

EXAMPLES

<<Overview of Power Module>>

FIG. 1 schematically illustrates an overview of a power module M as an example according to the jointed structure of the present invention. The power module M comprises: a power device 1 that comprises one or more IGBTs; and an insulating multilayer substrate 2 on which the power device 1 is mounted via a jointed part b.

The power device 1 comprises: a silicon chip 10; and an electrode layer 11 (first metal layer) that is formed of pure Cu and connected with the silicon chip 10 via an ohmic contact. The insulating multilayer substrate 2 comprises: an insulating layer 20 (base body, ceramic layer, insulating substrate) that is formed of AlN; a wiring layer 21 (second metal layer) that is formed of pure Al or pure Cu and jointed to one surface side of the insulating layer 20; and a heat-transfer layer 22 (third metal layer) that is formed of the same material as that of the wiring layer 21 and jointed to the other surface side of the insulating layer 20. The wiring layer 21 and the heat-transfer layer 22 are formed on the insulating layer 20 by metallization treatment. Such an insulating multilayer substrate 2 is commercially available as a DBA substrate or a DBC substrate. A water-cooling-type cooler (not shown) may be bonded by brazing to the heat-transfer layer 22 of the insulating multilayer substrate 2 as necessary to dissipate the heat generated in the power device 1.

Example 1

(1) Manufacturing of Samples

Sample 1 was manufactured as a power module M in which the electrode layer 11 of the silicon chip 10 was jointed by solid-phase joining to the wiring layer 21 of pure Al of the insulating multilayer substrate 2 (DBA substrate). Sample C1 was manufactured as a power module M in which the electrode layer 11 was bonded by soldering (brazing) to the wiring layer 21.

The thickness of each part was as follows: the silicon chip 10: 0.5 mm, the electrode layer 11: 500 nm, the insulating layer 20: 0.635 mm, the wiring layer 21: 0.4 mm, and the heat-transfer layer 22: 0.4 mm. The same applies to Example 2 to be described later.

Sample 1 was manufactured in the following manner. For each joining surface to be jointed of the electrode layer 11 and the wiring layer 21, pretreatment was first performed by nano-machining This pretreatment was performed using a single crystal diamond bite without lubricant oil under the conditions of a bite feed distance: 50 micrometers or less and a cutting depth: 100 nm or less.

The pretreated electrode layer 11 and wiring layer 21 were then pressed against each other with a pressure of 2 MPa in the air atmosphere while being heated at 200 degrees C. This state was maintained for 600 seconds. Sample 1 was thus obtained with the electrode layer 11 and the wiring layer 21 which were jointed by solid-phase joining (joining step).

On the other hand, Sample C1 was manufactured such that the electrode layer 11 and the wiring layer 21 were bonded by soldering using solder (Sn-0.7 mass % Cu/melting point of 227 degrees C.) while being heated at 250 degrees C. in a reducing reflow furnace.

(2) Cooling/Heating Cycle Test

Figure 2:
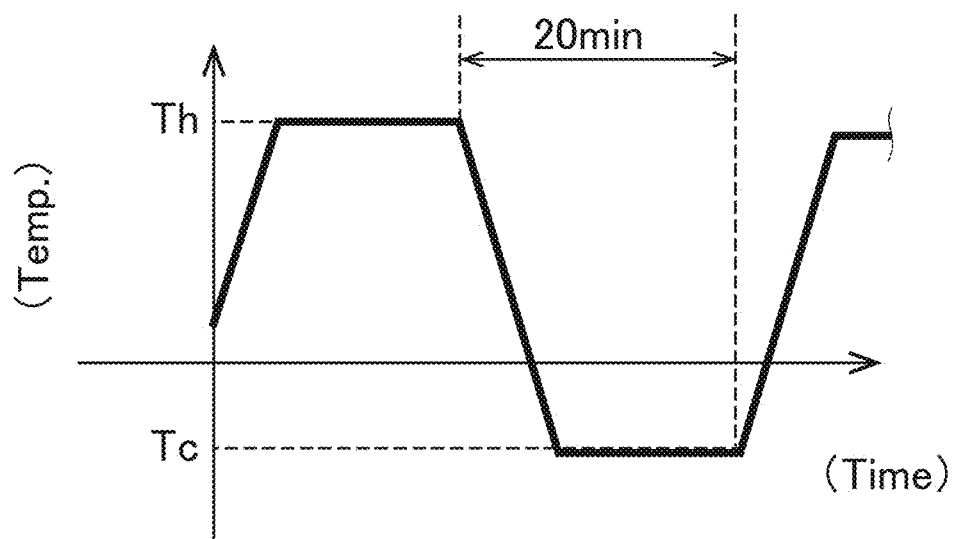
FIG. 2 is a graph illustrating a heat pattern used in a cooling/heating cycle test.

Cooling/heating cycle test was performed for Sample 1 and Sample C1 with the heat pattern of every one cycle as illustrated in FIG. 2, and the heat resistance property or the thermal shock resistance of each sample was tested. In this test, the heat pattern had a heating temperature Th: 240 degrees C. and a cooling temperature Tc: −40 degrees C.

(3) Evaluation

Even after 100 cycles of the above-described cooling/heating cycle, the joining state of Sample 1 was maintained, and it has been confirmed that the heat resistance property is excellent. In Sample C1, however, delamination occurred between the electrode layer 11 and the wiring layer 21 because Sample C1 was exposed to a temperature higher than the melting point during the heating in the cooling/heating cycle. The joining interface of Sample 1 was observed using an ultrasonic microscope (D9500S available from SONOSCAN) after the cooling/heating test (100 cycles), and it has also been confirmed that the delamination is little or nothing.

Example 2

(1) Manufacturing of Samples

Sample 2 was manufactured as a power module M in which the electrode layer 11 of the silicon chip 10 was jointed by solid-phase joining to the wiring layer 21 of pure Cu of the insulating multilayer substrate 2 (DBC substrate). Sample 3 was manufactured as a power module M in which the electrode layer 11 of the silicon chip 10 was jointed by solid-phase joining to the wiring layer 21 of pure Al of the insulating multilayer substrate 2 (DBA substrate) via a Ni thin film.

The solid-phase joining for Sample 2 and Sample 3 was performed in the same manner as that for Sample 1. The Ni thin film of Sample 3 is Ni plating formed on a surface of a commercially available DBA substrate. This Ni thin film is formed to ensure the solderability. This Ni thin film can be considered as being one of the metal layers according to the present invention.

(2) Cooling/Heating Cycle Test

Figure 3:
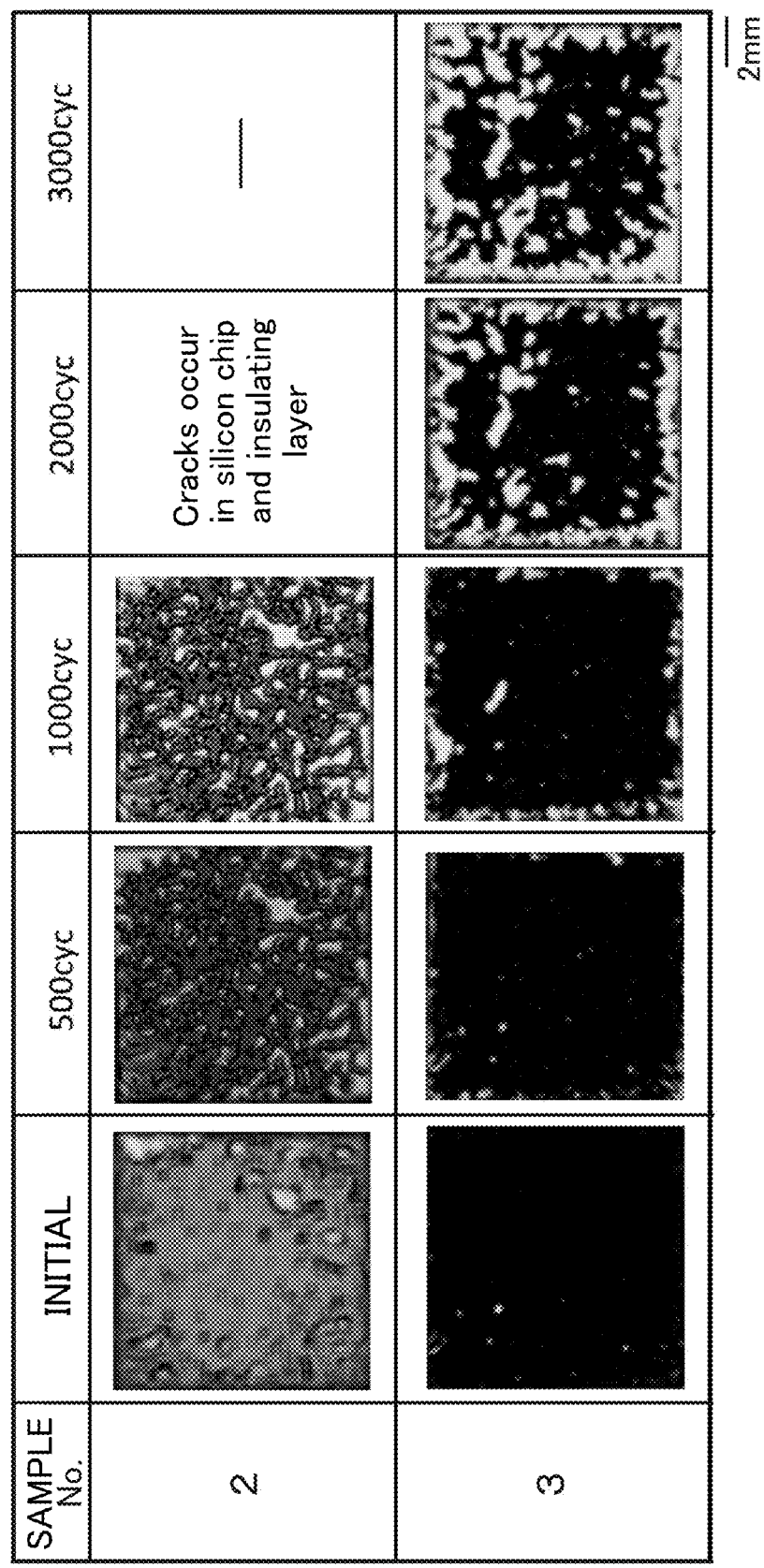
FIG. 3 is a set of ultrasonic microscope photographs illustrating appearances of jointed parts according to Sample 2 and Sample 3 after the cooling/heating cycle test.

Cooling/heating cycle test was performed for Sample 2 and Sample 3 with the heat pattern of every one cycle as illustrated in FIG. 2, and the heat resistance property or the thermal shock resistance of each sample was tested. In this test, the heat pattern had a heating temperature Th: 150 degrees C. and a cooling temperature Tc: −40 degrees C. FIG. 3 also illustrates photographs each obtained by observing the joining interface of each sample after a predetermined cycles of the cooling/heating cycle test using the previously-described ultrasonic microscope.

As found from FIG. 3, both of the samples exhibited excellent heat resistance property and thermal shock resistance. In particular, Sample 3 obtained by joining the electrode layer 11 of pure Cu to the wiring layer 21 (stress relaxing layer) of pure Al having a lower Young's modulus than that of pure Cu exhibited considerably enhanced thermal shock resistance and reliability.

(3) Interface Vicinity Microstructure

Figure 4:
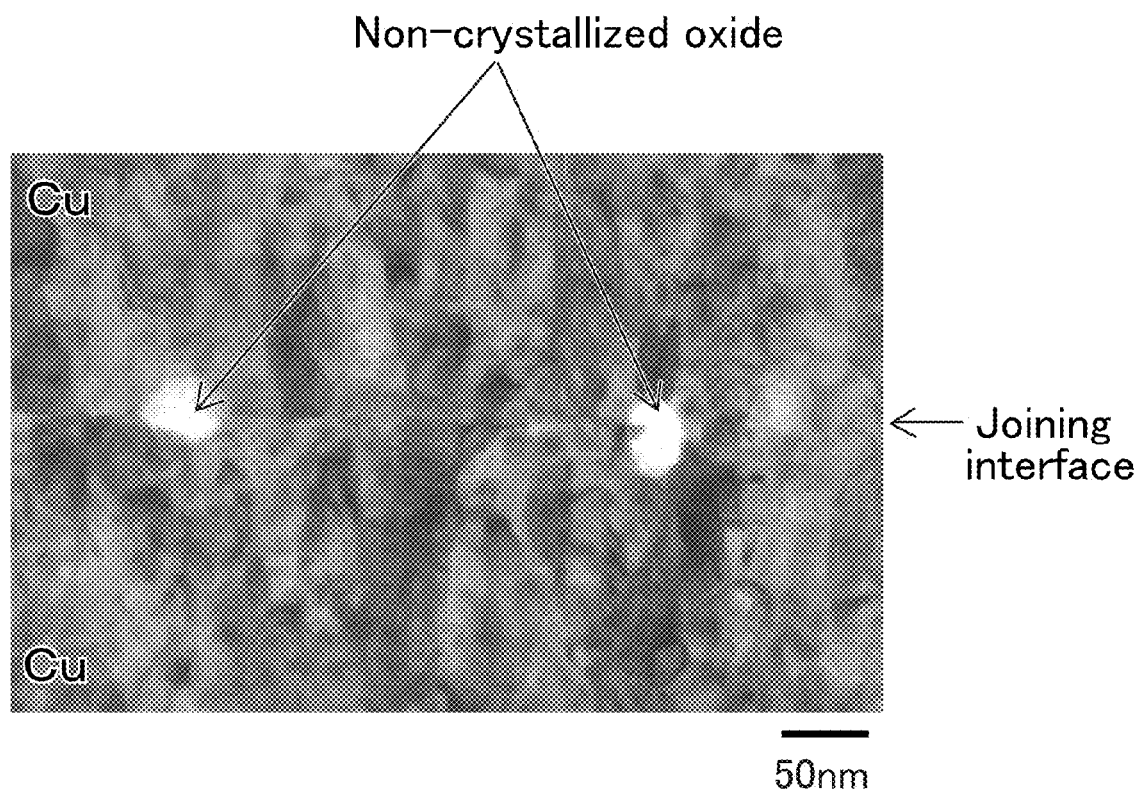
FIG. 4 is a TEM image illustrating a cross-section in the vicinity of the joining interface according to Sample 2.

FIG. 4 is a TEM image obtained by observing the joining interface of Sample 2 (before the cooling/heating test) using a transmission-type electron microscope (TEM). As found from FIG. 4, non-crystallized oxide phases of about several tens nanometers were observed in some spots along the joining interface. However, it has also been confirmed that the change in metallographic microstructures at both sides of the joining interface microstructure are little or nothing between before and after the joining

REFERENCE SIGNS LIST

M . . . Power module (jointed structure)
1 . . . Power device
10 . . . Silicon chip (heat generating body)
11 . . . Electrode layer (first metal layer)
2 . . . Insulating multilayer substrate
20 . . . Insulating layer (base body, ceramic layer)
21 . . . Stress relaxing layer (second metal layer)
22 . . . Heat-transfer layer

The invention claimed is:

1. A jointed structure comprising a first metal layer and a second metal layer, the first metal layer and the second metal layer being jointed together and having different coefficients of thermal expansion, the first metal layer and the second metal layer being jointed together by solid-phase joining via a jointing interface microstructure, the jointing interface microstructure including an amorphous oxide phase and having a thickness of 50 nm or less.

2. The jointed structure as recited in claim 1, wherein the second metal layer has an elastic modulus smaller than that of the first metal layer.

3. The jointed structure as recited in claim 2, wherein the second metal layer has a thickness larger than that of the first metal layer.

4. The jointed structure as recited in claim 1, wherein:
the first metal layer is an electrode layer of a semiconductor device;
the second metal layer is a wiring layer; and
the jointed structure constitutes at least a part of a power module.

5. The jointed structure as recited in claim 4, wherein:
the electrode layer is a copper layer; and
the wiring layer is an aluminum layer.

6. A method of manufacturing a jointed structure, the jointed structure comprising a first metal layer and a second metal layer, the first metal layer and the second metal layer being jointed together and having different coefficients of thermal expansion, the first metal layer having a first jointing surface that is a jointing surface before jointing, the second metal layer having a second jointing surface that is a jointing surface before jointing, each of the first jointing surface and the second jointing surface having a fine irregular profile, the fine irregular profile having a surface roughness of 0.02 micrometers or less as a center line average roughness (Ra) and an actual surface area (So) that is larger by 15% or more than a reference surface area (St) calculated from an outer shape dimension, the method comprising:

causing the first jointing surface and the second jointing surface to be in contact with each other;

applying pressure, temperature or vibration thereby to joint the first jointing surface and the second jointing surface to each other, and forming a jointing interface microstructure including an amorphous oxide phase.

* * * * *